United States Patent
Wang (10) Patent No.: US 11,837,013 B2
(45) Date of Patent: Dec. 5, 2023

(54) IMAGE SENSOR, FINGERPRINT DETECTION APPARATUS AND ELECTRONIC DEVICE

(71) Applicant: SHENZHEN GOODIX TECHNOLOGY CO., LTD., Guangdong (CN)

(72) Inventor: Chengzuo Wang, Guangdong (CN)

(73) Assignee: SHENZHEN GOODIX TECHNOLOGY CO., LTD., Guangdong (CN)

( * ) Notice: Subject to any disclaimer, the term of this patent is extended or adjusted under 35 U.S.C. 154(b) by 67 days.

(21) Appl. No.: 17/505,001

(22) Filed: Oct. 19, 2021

(65) Prior Publication Data
US 2022/0058364 A1 Feb. 24, 2022

Related U.S. Application Data

(63) Continuation of application No. PCT/CN2020/110604, filed on Aug. 21, 2020.

(51) Int. Cl.
*G06F 40/18* (2020.01)
*G06V 40/13* (2022.01)
*G06V 10/141* (2022.01)
*G06V 10/147* (2022.01)
*H01L 27/146* (2006.01)

(52) U.S. Cl.
CPC ........ *G06V 40/1318* (2022.01); *G06V 10/141* (2022.01); *G06V 10/147* (2022.01); *H01L 27/14627* (2013.01)

(58) Field of Classification Search
CPC ............ G06V 40/1318; G06V 10/141; G06V 10/147; H01L 27/14627
See application file for complete search history.

(56) References Cited

U.S. PATENT DOCUMENTS

| | | |
|---|---|---|
| 2004/0109074 A1 | 6/2004 | Jung |
| 2005/0206752 A1 | 9/2005 | Lim |
| 2008/0258047 A1 | 10/2008 | Sakakibara et al. |
| 2009/0128678 A1 | 5/2009 | Kitami et al. |
| 2010/0013976 A1 | 1/2010 | Sakakibara et al. |
| 2011/0127409 A1 | 6/2011 | Sakakibara et al. |
| 2011/0221942 A1 | 9/2011 | Taura |
| 2011/0261177 A1 | 10/2011 | Moore |
| 2013/0208110 A1 | 8/2013 | Wang et al. |

(Continued)

FOREIGN PATENT DOCUMENTS

| | | |
|---|---|---|
| CN | 1447591 A | 10/2003 |
| CN | 103283216 A | 9/2013 |

(Continued)

*Primary Examiner* — Stephen G Sherman
(74) *Attorney, Agent, or Firm* — Scully, Scott, Murphy & Presser, P.C.

(57) ABSTRACT

An image sensor, a fingerprint detection apparatus, and an electronic device are provided. The image sensor includes a pixel circuit array, wherein each pixel circuit is configured to generate an output signal according to a received light signal; and an output circuit is configured to simultaneously receive output signals of a plurality of pixel circuits in the pixel circuit array, and output a signal average value of the output signals of the plurality of pixel circuits. The image sensor has a small area and power consumption.

15 Claims, 7 Drawing Sheets

(56) References Cited

U.S. PATENT DOCUMENTS

| | | | |
|---|---|---|---|
| 2019/0114458 A1* | 4/2019 | Cho | G06V 40/1306 |
| 2020/0036930 A1 | 1/2020 | Hanzawa | |
| 2021/0124893 A1* | 4/2021 | Wang | G06V 40/1365 |

FOREIGN PATENT DOCUMENTS

| | | | | |
|---|---|---|---|---|
| CN | 103780850 | A | | 5/2014 |
| CN | 103875238 | A | | 6/2014 |
| CN | 104137534 | A | | 11/2014 |
| CN | 105516625 | A | | 4/2016 |
| CN | 102137239 | B | | 5/2016 |
| CN | 107211101 | A | | 9/2017 |
| CN | 107526993 | A | * | 12/2017 |
| CN | 109257548 | A | | 1/2019 |
| CN | 109496427 | A | | 3/2019 |
| CN | 110580442 | A | | 12/2019 |
| CN | 110720212 | A | | 1/2020 |
| CN | 110996022 | A | | 4/2020 |
| CN | 111052141 | A | | 4/2020 |
| CN | 111133445 | A | | 5/2020 |
| CN | 111259715 | A | | 6/2020 |
| CN | 111328398 | A | | 6/2020 |
| CN | 111464763 | A | | 7/2020 |
| CN | 111464765 | A | | 7/2020 |
| JP | 2016005161 | A | | 1/2016 |
| KR | 20050092579 | A | | 9/2005 |
| KR | 20090083292 | A | | 8/2009 |
| KR | 20190132402 | A | | 11/2019 |
| WO | WO-2020082289 | A1 | * | 4/2020 ............ H04N 5/335 |

\* cited by examiner

IMAGE SENSOR, FINGERPRINT DETECTION APPARATUS AND ELECTRONIC DEVICE

CROSS-REFERENCE TO RELATED APPLICATIONS

This application is a continuation of International Application No. PCT/CN2020/110604, filed on Aug. 21, 2020, the disclosure of which is hereby incorporated by reference in its entirety.

TECHNICAL FIELD

Embodiments of the present application relate to the field of image sensors, and more particularly, to an image sensor, a fingerprint detection apparatus and an electronic device.

BACKGROUND

An image sensor is an apparatus that converts a light signal into an electrical signal. The image sensor generally includes a pixel circuit, an output circuit, etc., where the pixel circuit may convert a received light signal into an electrical signal and then input to the output circuit, and the output circuit may read out the electrical signal output by the pixel circuit. The area and power consumption of the image sensor has become one of the factors affecting its development. Therefore, how to reduce the area and power consumption of the image sensor has become an urgent problem to be solved.

SUMMARY

Embodiments of the present application provide an image sensor, a fingerprint detection apparatus and an electronic device, having a small area and power consumption.

In the first aspect, an image sensor is provided, including: a pixel circuit array, where each pixel circuit is configured to generate an output signal according to a received light signal; and an output circuit, configured to simultaneously receive output signals of a plurality of pixel circuits in the pixel circuit array, and output a signal average value of the output signals of the plurality of pixel circuits.

In the solution, the output circuit of the image sensor may simultaneously receive the output signals of the plurality of pixel circuits in the pixel circuit array, and output the signal average value of the output signals of the plurality of pixel circuits, so as to realize combining and averaging the output signals of a plurality of pixel circuits in the output circuit. For a scene that needs to perform signal combination and averaging, the number of output circuits is significantly reduced, and an area and power consumption of the image sensor are reduced.

In a possible implementation manner, the image sensor further includes: a sampling circuit, configured to collect the signal average value output by the output circuit.

Since each output circuit only needs one sampling circuit to collect its output signal average value, the number of sampling circuits in the image sensor is also reduced, which further reduces the area and power consumption of the image sensor.

In a possible implementation manner, the pixel circuit array is composed of a plurality of sub-arrays, the plurality of pixel circuits include pixel circuits with the same number in the plurality of sub-arrays, and the pixel circuits with the same number in respective sub-arrays are located in the same row and column in respective corresponding sub-arrays.

In order to facilitate selecting a plurality of pixel circuits in the pixel circuit structure that need to perform signal combination and averaging, the plurality of pixel circuits may be distributed such that the plurality of pixel circuits are located in the same row and column in the pixel circuit sub-array where they are located. Therefore, the plurality of pixel circuits that currently need to perform signal combination and averaging may be gated by means of row scanning and column scanning.

In a possible implementation manner, the output circuit includes an operational amplifier, the operational amplifier includes a first input end and a second input end, a first output end of the plurality of pixel circuits is connected to the first input end of the operational amplifier, and a second output end of the plurality of pixel circuits is connected to the second input end of the operational amplifier.

In a possible implementation manner, the operational amplifier further includes a plurality of groups of transistors connected to its output end, where each group of transistors includes a first transistor and a second transistor connected in series, where, the number of the plurality of groups of transistors is the same as the number of the plurality of pixel circuits, a transconductance of the first transistor is the same as that of a source follow input transistor of a pixel circuit, the second transistor is a gating switch transistor same as a gating switch transistor of the pixel circuit, and the source follow input transistor and the gating switch transistor are connected in series between the first output end and the second output end of the pixel circuit.

In a possible implementation manner, the operational amplifier further includes a current mirror, one end of the current mirror is connected to the source follow input transistor of the each pixel circuit, and the other end of the current mirror is connected to the first transistor in each group of transistors.

In a possible implementation manner, the operational amplifier further includes a current source, one end of the current source is connected to the gating switch transistor of the each pixel circuit and is connected to the second transistor in each group of transistors, and the other end of the current source is grounded.

In a possible implementation manner, the operational amplifier further includes a current mirror, one end of the current mirror is connected to the gating switch transistor of the each pixel circuit, and the other end of the current mirror is connected to the second transistor in each group of transistors.

In a possible implementation manner, the operational amplifier further includes a current source, one end of the current source is connected to the source follow input transistor of the each pixel circuit and is connected to the first transistor in each group of transistors, and the other end of the current source is grounded.

In a possible implementation manner, the pixel circuit further includes a photodiode, a parasitic capacitor, a reset switch transistor and a transmission transistor, where, an cathode of the photodiode is grounded, an anode of the photodiode is connected to a source of the transmission transistor, a gate of the transmission transistor is controlled by a transmission signal, and a drain of the transmission transistor is connected to one end of the parasitic capacitor, a gate of the source follow input transistor and a source of the reset switch transistor, a grate of the transmission transistor is controlled by the transmission signal, the other end of the parasitic capacitor is grounded, a drain of the reset switch is connected to a reset voltage, a gate of the reset switch transistor is controlled by a reset signal, a gate of the gating switch transistor is controlled by a gating signal, a source of the source follow input transistor is connected to a drain of the gating switch transistor, and one end of a drain of the source follow input transistor and one end of a source of the gating switch transistor are used as the first output end and the second output end of the pixel circuit, respectively.

In a possible implementation manner, the sampling circuit includes a first sampling capacitor and a second sampling capacitor, the first sampling capacitor and the second sampling capacitor are configured to collect the signal average value twice before and after the pixel circuit is exposed, respectively, so as to realize correlated double sampling.

Adopting correlated double sampling may eliminate the interference of reset noises in the pixel circuit and improve the performance of the image sensor.

In a possible implementation manner, the image sensor is configured in a fingerprint detection apparatus, where, the light signal received by the plurality of pixel circuits is a light signal in the same direction returned by a finger.

In a second aspect, a fingerprint detection apparatus is provided, including:

the image sensor in the foregoing first aspect and any one of the possible implementation manners of the first aspects.

In a possible implementation manner, where the fingerprint detection apparatus further includes a light path guiding structure arranged above each sub-array, the light path guiding structure includes a microlens and a plurality of light-blocking layers arranged below the microlens, the uppermost light-blocking layer in the plurality of light-blocking layers is provided with at least one light-passing hole, and each light-blocking layer in the remaining light-blocking layers is provided with a plurality of light-passing holes to form a light guide path in a plurality of directions, the microlens is configured to converge a light signal returned by a finger above the display screen, and the light guide path in the plurality of directions is configured to guide the light signal in the corresponding direction to the corresponding pixel circuit.

In a third aspect, an electronic device is provided, including: the fingerprint detection apparatus in the foregoing second aspect and any one of the possible implementation manners of the second aspect.

DESCRIPTION OF EMBODIMENTS

Technical solutions of the present application are described below in combination with accompanying drawings.

The image sensor in an embodiment of the present application may be applied to any scene that needs to perform signal combination and averaging. For example, the image sensor may be applied in a fingerprint detection apparatus to collect a signal returned by a finger to obtain a fingerprint image of the finger.

Figure 1:
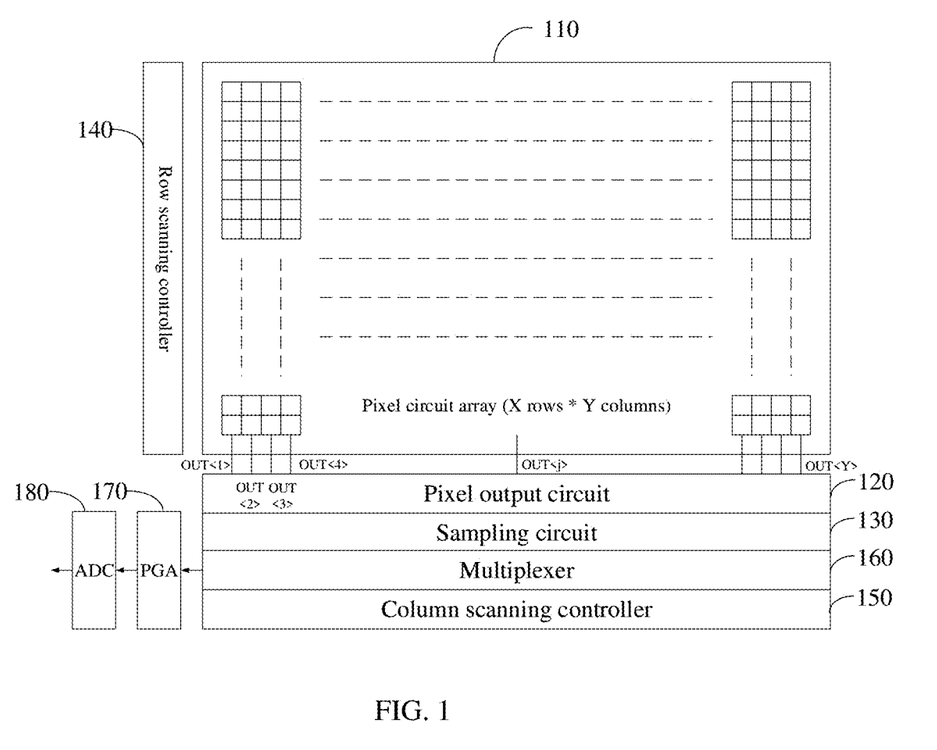
FIG. 1 is a schematic structural diagram of a traditional image sensor.

FIG. 1 is a schematic structural diagram of a traditional image sensor. The image sensor shown in FIG. 1 includes a pixel circuit array 110, an output circuit 120, a sampling circuit 130, a row scanning controller 140, a column scanning controller 150, a multiplexer 160, and a programmable gain amplifier (PGA) 170 and an analog-to-digital converter (ADC) 180, etc. The gated pixel circuit in the pixel circuit array 110 converts the respective received light signal into an electrical signal, and inputs to the output circuit 120, and the electrical signal is read out by the output circuit 120. The output circuit 120 may have various forms, including but not limited to a source follower of a traditional 4T pixel circuit structure. The sampling circuit 130 may sample and hold the signal output by the output circuit 120, and perform correlated double sampling (CDS), then sequentially output to the PGA circuit 170 and the ADC circuit 180 under the control of the multiplexer, and perform operations such as amplification and analog-to-digital conversion, respectively, to obtain final data.

Figure 2:
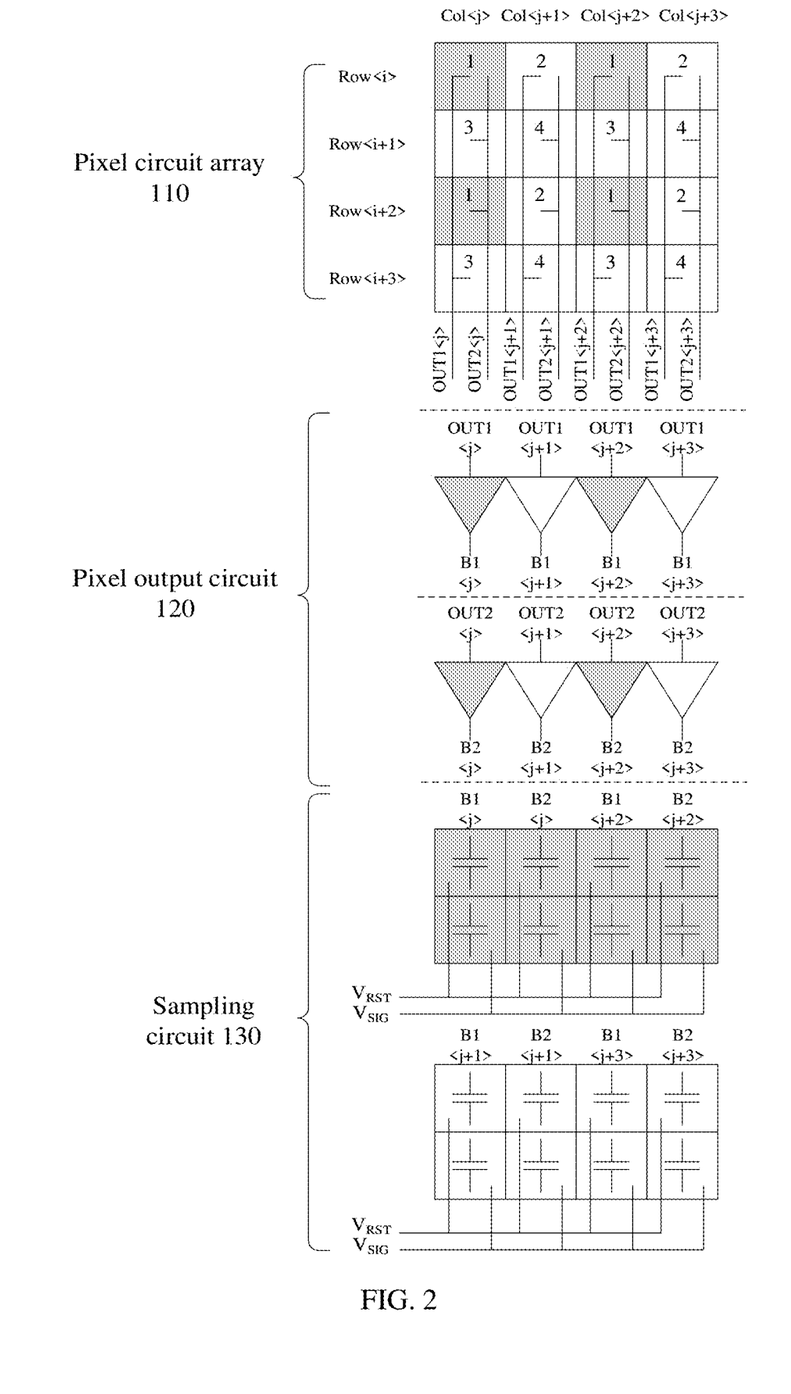
FIG. 2 is a schematic diagram of an operating principle based on the image sensor of FIG. 1.

FIG. 2 is a schematic diagram of an operating principle based on the image sensor as shown in FIG. 1. Among them, in FIG. 2, Row represents a row, and Col represents a column. In the pixel circuit array 110 shown in FIG. 2, output signals of the pixel circuits numbered 1 needs to perform signal combination and averaging, output signals of the pixel circuits numbered 2 needs to perform signal combination and averaging, output signals of the pixel circuits numbered 3 needs to perform signal combination and averaging, and output signals of the pixel circuits numbered 4 needs to perform signal combination and averaging.

FIG. 2 shows 4 sub-arrays, respectively: a sub-array composed of four pixel circuits in the upper left corner, a sub-array composed of four pixel circuits in the upper right corner, and a sub-array composed of four pixel circuits in the lower left corner, and a sub-array composed of four pixel circuits in the lower right corner. It should be understood that a signal average value corresponding to the output signals of the pixel circuits with the same number in every 4 sub-arrays after subsequent processing may be used as pixel data of one pixel in an image collected by the image sensor 300. For example, the signal average value corresponding to the output signals of the 4 pixel circuits 1 after subsequent processing may be used as the pixel data of the pixel circuit 1, and the signal average value corresponding to the output signals of the 4 pixel circuit 2 after subsequent processing may be used as the pixel data of the pixel circuit 2.

Taking the 4 pixel circuits 1 as an example, when the ith row and the i+2th row are gated, the output signal of the pixel circuit 1 in the ith row and jth column is OUT1<j>, the output signal OUT1<j> is read out by the corresponding output circuit 120, the signal B1<j> is obtained, and the signal B1<j> will be sampled and held by the corresponding sampling capacitor in the sampling circuit; the output signal of pixel circuit 1 in the i+2th row and the jth column is OUT2<j>, the output signal OUT2<j> is read out by the corresponding output circuit 120, the signal B2<j> is obtained, and the signal B2<j> will be sampled and held by the corresponding sampling capacitor in the sampling circuit; the output signal of the pixel circuit 1 in the ith row and the j+2th column is OUT1<j+2>, the output signal OUT1<j+2> is read out by the corresponding output circuit 120, the signal B1<j+2> is obtained, and the signal B 1<j+2> will be sampled and held by the corresponding sampling capacitor in the sampling circuit; and the output signal of pixel circuit 1 in the i+2th row and the jth column is OUT2<j+2>, the output signal OUT2<j+2> is read out by the corresponding output circuit 120, the signal B2<j+2> is obtained, and the signal B2<j+2> will be sampled and held by the corresponding sampling capacitor in the sampling circuit. The 4 pixel circuits 1 in the pixel circuit array 110 pass through the respective corresponding output circuits 120, and finally obtain the signals B1<j>, B2<j>, B1<j+2> and B2<j+2>, respectively; and then after passing through the respective corresponding sampling circuits 130, combined and averaged data is obtained, which are respectively denoted as $V_{RST}$ and $V_{SIG}$. Among them, $V_{RST}$ and $V_{SIG}$ are signals collected twice before and after exposure, respectively. After correlated double sampling is performed on the two signals, a noise signal may be eliminated, and then the signals after correlated double sampling are input to the PGA circuit 170 and the ADC circuit 180 to perform amplification and analog-to-digital conversion, to obtain the pixel data of the pixel circuit 1.

When the ith row and the i+2th row are gated, the 4 pixel circuits 2 pass through a similar process, and finally $V_{RST}$ and $V_{SIG}$ corresponding to the pixel circuit 2 may also be obtained. After correlated double sampling is performed, the two signals are input to the PGA circuit 170 and the ADC circuit 180 to perform amplification and analog-to-digital conversion, to obtain the pixel data of the pixel circuit 2.

Next, when the i+1th row and the i+3th row are gated, similar operations are performed on the 4 pixel circuits 3 and the 4 pixel circuits 4, and finally respective pixel data are obtained.

It may be seen that in FIG. 2, a plurality of pixel circuits that need to perform signal combination and averaging are read out by a plurality of output circuits 120, and then sampled and held by a plurality of sampling capacitors, and finally performed signal combination and averaging. Specifically, if a plurality of sub-pixels that need to perform signal combination and averaging are distributed in N rows, and the pixel array 110 includes Y columns, then N×Y output circuits 120 and N×Y sampling circuits 130 are needed. Therefore, a large number of output circuits 120 and sampling circuits 130 need to be arranged in the image sensor, resulting in a large area and power consumption of the image sensor.

For this reason, an embodiment of the present application provides an image sensor that has a small area and power consumption.

Figure 3:
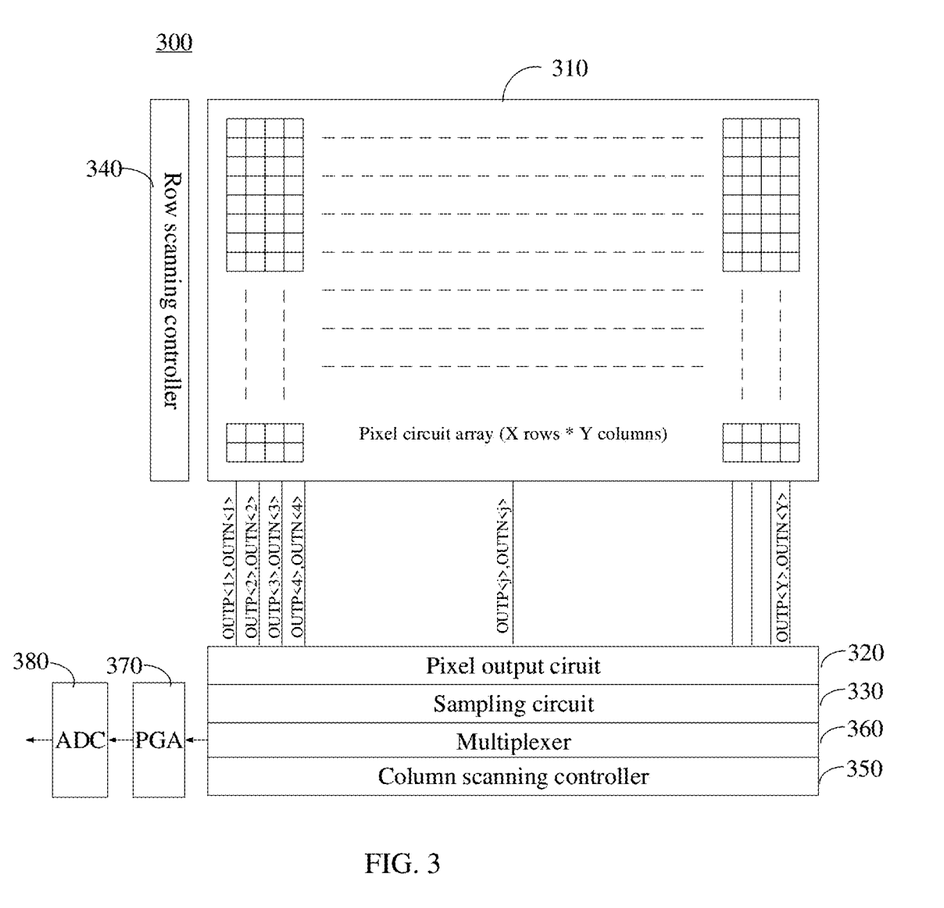
FIG. 3 is a schematic diagram of an image sensor according to an embodiment of the present application.

FIG. 3 is a schematic diagram of an image sensor according to an embodiment of the present application. As shown in FIG. 3, the image sensor 300 includes a pixel circuit array 310 and an output circuit 320. The output circuit 320 may also be referred to as a readout circuit 320 or a read circuit 320.

Among that, each pixel circuit in the pixel circuit array 310 is configured to generate an output signal according to a received light signal; and The output circuit 320 is configured to simultaneously receive output signals of a plurality of pixel circuits in the pixel circuit array 310, and output a signal average value of the output signals of the plurality of pixel circuits.

In the embodiment, the output circuit 320 of the image sensor 300 may simultaneously receive the output signals of the plurality of pixel circuits in the pixel circuit array 310, and output the signal average value of the output signals of the plurality of pixel circuits, so as to realize combining and averaging the output signals of a plurality of pixel circuits in the output circuit 320. For a scene that needs to perform signal combination and averaging, the number of output circuits is significantly reduced, and an area and power consumption of the image sensor are reduced, and the costs are reduced.

Further, optionally, as shown in FIG. 3, the image sensor 300 may further include a sampling circuit 330, configured to collect the signal average value output by the output circuit 320.

Since each output circuit only needs one sampling circuit to collect its output signal average value, the number of sampling circuits in the image sensor is also reduced, which further reduces the area and power consumption of the image sensor.

Further, optionally, as shown in FIG. 3, the image sensor 300 may further include a multiplexer switch 360, configured to gate the signal average value output by a certain path of a plurality of paths, so that the signal average value output in the plurality of paths is sequentially processed by a subsequent common processing circuit.

Further, optionally, as shown in FIG. 3, the image sensor 300 may further include a row scanning controller 340 and a column scanning controller 350, configured to control gating of rows and columns in the pixel circuit array 310, respectively.

Further, optionally, as shown in FIG. 3, the image sensor 300 may further include a PGA circuit 370, configured to perform amplification on the received signal.

Further, optionally, as shown in FIG. 3, the image sensor 300 may further include an ADC circuit 370, configured to perform analog-to-digital conversion on the amplified signal.

Figure 4:
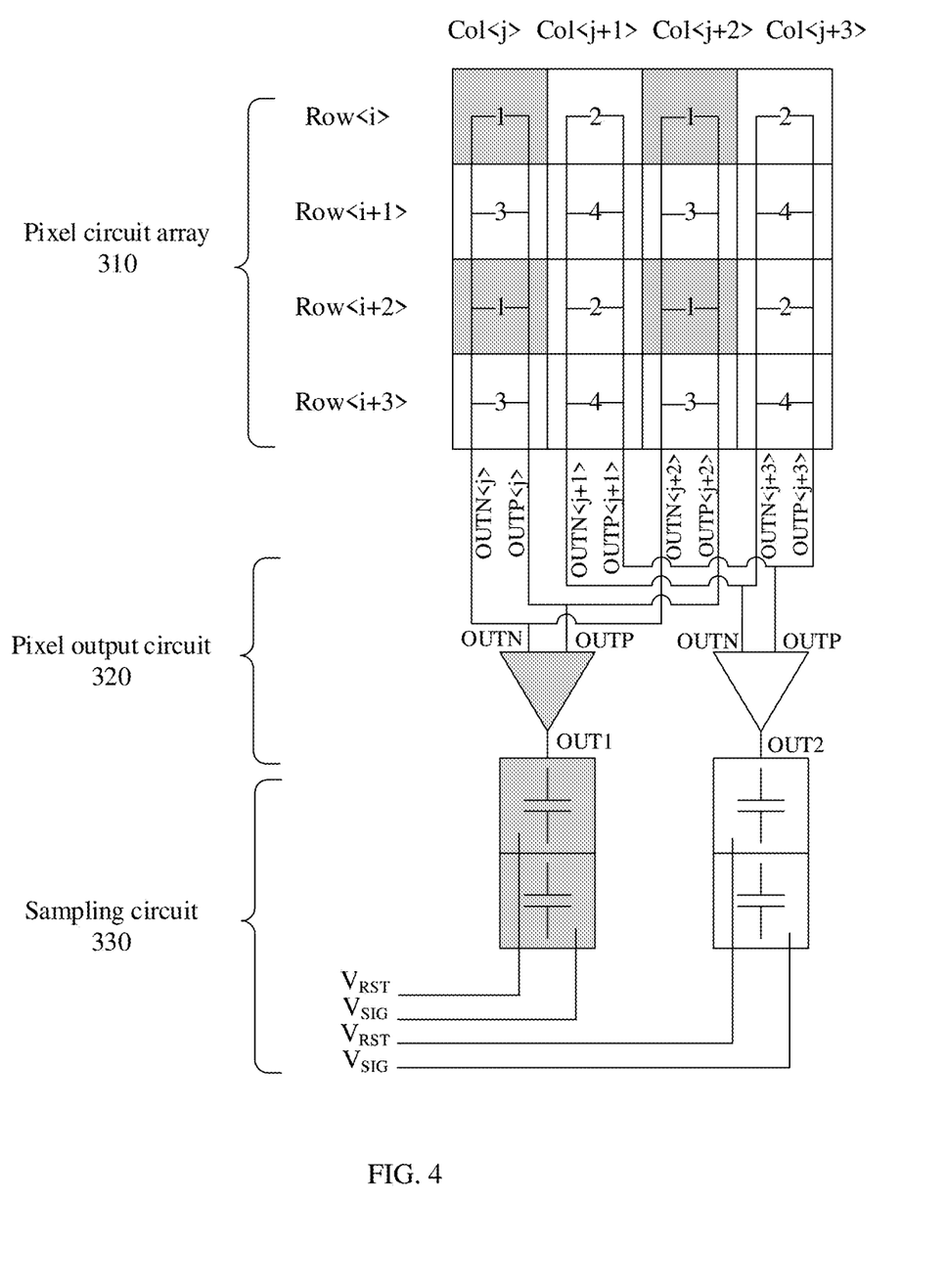
FIG. 4 is a schematic diagram of an operating principle based on the image sensor of FIG. 3.

In an embodiment of the present application, the image sensor 300 may simultaneously perform signal combination and averaging on a plurality of pixel circuits at any position in the pixel circuit array 310. In order to facilitate selecting the plurality of pixel circuits in the pixel circuit array 310 that need to perform signal combination and averaging, preferably, in an implementation manner, the pixel circuit array 310 is composed of a plurality of sub-arrays, the plurality of pixel circuits include pixel circuits with the same number in the plurality of sub-arrays, and the pixel circuits with the same number in respective sub-array are located in the same row and column in respective corresponding sub-arrays. For example, all the pixel circuits numbered 1 in sub-arrays are located in the first row and first column of the corresponding sub-arrays, and all the pixel circuits numbered 2 in sub-arrays are located in the first row and second column of corresponding sub-arrays, etc. In this way, the plurality of pixel circuits that currently need to perform signal combination and averaging may be gated conveniently by means of row scanning and column scanning, as shown in FIG. 2 and FIG. 4, for example.

Optionally, in an implementation manner, the output circuit 320 includes an operational amplifier, and the operational amplifier includes a first input end and a second input end. Among that, a first output end of the plurality of pixel circuits is connected to the first input end of the operational amplifier, and a second output end of the plurality of pixel circuits is connected to the second input end of the operational amplifier.

In the method shown in FIG. 2, first, the output signals of the plurality of pixel circuits is read out by a plurality of output circuits 320, and sampled and held by a plurality of sampling circuits 330, respectively, and then performed signal combination and averaging. In the embodiment, two outputs of the plurality of pixel circuits that need to perform signal combination and averaging are used as two inputs of the output circuit 320, respectively, so that the output signals of the plurality of pixel circuits completes combination and averaging within the output circuit 320, which significantly reduces the number of the output circuits 320 and the number of the sampling circuits 330, significantly reduces the area and power consumption of the image sensor, and reduces the costs.

In order to explain the image sensor 300 in the embodiment more clearly, an operating principle of the image sensor 300 is described in detail below by taking FIG. 4 as an example. Among them, in FIG. 4, Row represents a row, and Col represents a column. FIG. 4 only shows 4 sub-arrays in the pixel circuit array 310, and each sub-array includes 2×2 pixel circuits, numbered 1, 2, 3, and 4, respectively. Each sub-array may also include other numbers of pixel circuits, for example, each sub-array includes R×R pixel circuits, where R>1. What is shown in FIG. 4 is only an example, and should not limit the scope of protection of the present application. In addition, the sub-arrays included in the pixel circuit array 310 may also have other numbers. For example, the pixel circuit array 310 may include P×Q×M sub-arrays, and P and Q are positive integers, where M represents how many output signals of the pixel circuits need to perform signal combination and averaging, for example, M=4.

In the pixel circuit array 110 shown in FIG. 4, the output signals of the pixel circuits numbered 1 in the 4 sub-arrays need to perform signal combination and averaging, and the output signals of the pixel circuits numbered 2 need to perform signal combination and averaging, the output signals of the pixel circuits numbered 3 need to perform signal combination and averaging, and the output signals of the pixel circuits numbered 4 need to perform signal combination and averaging.

It should be understood that the signal average value corresponding to the output signals of the pixel circuits with the same number in every 4 sub-arrays may be used as pixel data of one pixel in an image collected by the image sensor 300. Among that, when the pixel circuit array 310 includes P×Q×M sub-arrays, an image collected by the image sensor 300 includes P×Q pixel points, where it needs to perform signal combination and averaging on the output signals of the M pixel circuits. For example, when M=4, the signal average value corresponding to the output signals of the 4 pixel circuits 1 is used as the pixel data of the pixel circuit 1, the signal average value corresponding to the output signals of the 4 pixel circuits 2 is used as the pixel data of the pixel circuit 2, the signal average value corresponding to the output signals of the 4 pixel circuit 3 is used as the pixel data of the pixel circuit 3, and the signal average value corresponding to the output signals of the 4 pixel circuits 4 is used as the pixel data of the pixel circuit 4, etc.

Taking the 4 pixel circuits 1 as an example, when the ith row and the i+2th row are gated, the pixel circuit 1 in the ith row and the jth column, the pixel circuit 1 in the i+2th row and the jth column, the pixel circuit 1 in the ith row and the j+2th column, and the pixel circuit 1 in the i+2th row and the j+2th column are all gated.

The output signal OUTN of the 4 pixel circuits 1 is input to the same input end of the corresponding output circuit 320, and the output signal OUTP of the 4 pixel circuits 1 is input to the other input end of the corresponding output circuit 320. That is, the OUTN<j> output by the pixel circuit 1 in the ith row and the jth column and the pixel circuit 1 in the i+2th row and the jth column, and the output OUTN<j+2> of the pixel circuit 1 in the ith row and the j+2 column and the pixel circuit 1 in the i+2 row and j+2 column are input to the same input end of the corresponding output circuit 320. Moreover, the OUTP<j> output by the pixel circuit 1 in the ith row and the jth column and the pixel circuit 1 in the i+2th row and the jth column, and the output OUTP<j+2> of the pixel circuit 1 in the ith row and the j+2 column and the i+2th row and j+2 column are input to the other input end of the output circuit 320.

The output circuit 320 receives the output signals OUTN and OUTP of the 4 pixel circuits 1 and outputs OUT1, where OUT1 is the combined and averaged output signals of the 4 pixel circuits 1. The signal OUT1 is sampled and held by the corresponding sampling circuit 330, and finally the combined and averaged data is output, denoted as $V_{RST}$ and $V_{SIG}$, respectively. Among them, $V_{RST}$ and $V_{SIG}$ are signals collected twice before and after exposure, respectively. After correlated double sampling is performed on the two signals, a certain noise signal may be eliminated, and then the signals after correlated double sampling are input to the PGA circuit 370 and the ADC circuit 380 to perform amplification and analog-to-digital conversion, to obtain pixel data of the pixel circuit 1.

When the ith row and the i+2th row are gated, the pixel circuit 2 in the ith row and the j+1 th column, the pixel circuit 1 in the i+2th row and the j+1 th column, and the pixel circuit 1 in the ith row and the j+3th column, and the pixel circuit 2 in the i+2th row and the j+3th column are all gated. The 4 pixel circuits 2 pass through a similar process, and finally $V_{RST}$ and $V_{SIG}$ corresponding to the pixel circuit 2 may also be obtained. After correlated double sampling is performed, the two signals are input to the PGA circuit 170 and the ADC circuit 180 to perform amplification and analog-to-digital conversion, to obtain pixel data of the pixel circuit 2.

Next, when the i+1th row and the i+3th row are gated, similar operations are performed on the 4 pixel circuits 3 and the 4 pixel circuits 4, and finally respective pixel data are obtained.

It may be seen that in FIG. 3, the combination and averaging of the output signals of a plurality of pixel circuits with the same number are completed in an internal circuit of the corresponding output circuit 320, which significantly reduces the number of the output circuits 320 and the number of the sampling circuits 330, and significantly reduces the area and power consumption of the image sensor.

An embodiment of the present application does not define a structure of each pixel circuit in the pixel circuit array 310.

Optionally, in an implementation manner, the pixel circuit further includes a photodiode, a parasitic capacitor, a reset switch, and a transmission transistor.

Among that, an cathode of the photodiode is grounded, an anode of the photodiode is connected to a source of the transmission transistor, a gate of the transmission transistor is controlled by a transmission signal, and a drain of the transmission transistor is connected to one end of the parasitic capacitor, a gate of the source follow input transistor and a source of the reset switch transistor, the other end of the parasitic capacitor is grounded, a drain of the reset switch transistor is connected to a reset voltage, a gate of the reset switch is controlled by a reset signal, a gate of the gating switch is controlled by a gating signal, a source of the source follow input transistor is connected to a drain of the gating switch transistor, and one end of a drain of the source follow input transistor and one end of a source of the gating switch transistor are used as the first output end and the second output end of the pixel circuit, respectively.

Figure 5:
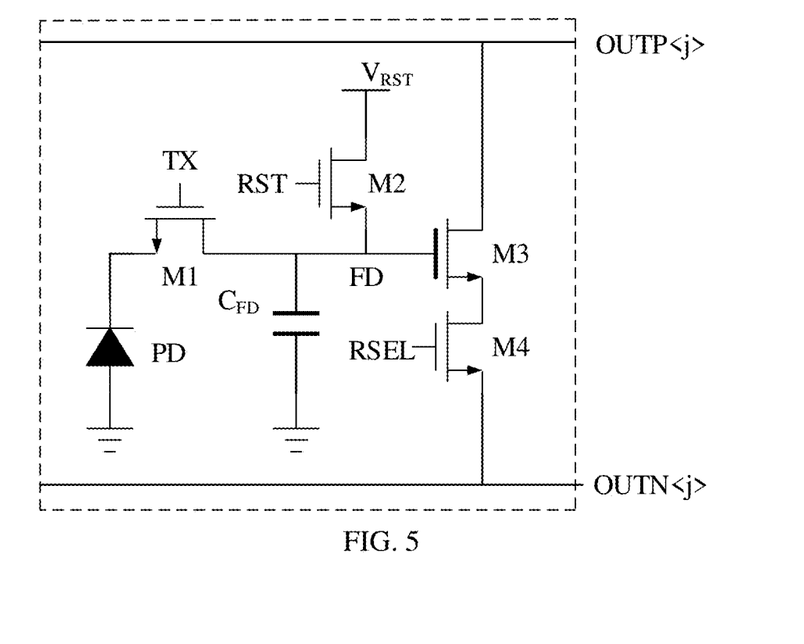
FIG. 5 is a schematic structural diagram of a possible pixel circuit according to an embodiment of the present application.

For example, as shown in FIG. 5, a pixel circuit includes a photodiode (PD), a parasitic capacitor $C_{FD}$, a transmission transistor M1, a reset switch M2, a source follow input transistor M3, and a gating switch transistor M4. The reset switch transistor M2 is configured to reset the photodiode PD. When the gating switch transistor M4 is turned on, it indicates that the pixel circuit is currently gated to perform signal combination and averaging.

Among that, an anode of the photodiode PD is grounded, an anode of the photodiode PD is connected to a source of the transmission transistor M1, a gate of the transmission transistor M1 is controlled by a transmission signal TX, and a drain of the transmission transistor M1 is connected to one end of the parasitic capacitor $C_{FD}$, a gate of the source follow input transistor M3 and a source of the reset switch transistor M2 are connected, respectively, the other end of the parasitic capacitor $C_{FD}$ is grounded, a drain of the reset switch transistor is connected to a reset voltage $V_{RST}$, a gate of the reset switch transistor is controlled by a reset signal RST, a source of the source follow input transistor M3 is connected to a drain of the gating switch transistor M4, a drain of the source follow input transistor M3 is connected to a power source voltage VCCP, and a gate of the gating switch transistor M4 is controlled by a gating signal RSEL.

When light irradiates the photodiode PD to generate an electric charge, the electric charge may be controlled by the parasitic capacitor $C_{FD}$ when the transmission transistor M1 is turned on, so that a corresponding voltage is generated on a FD point to realize the process of converting the light signal into an electrical signal. Affected by the voltage at the FD point, the drain of the source follow input transistor M3 and a source of the gating switch transistor M4 generate voltage signals OUTN and OUTP, respectively, that is, two output signals of the pixel circuit.

The reset signal RST<i> of each row of pixel circuit is connected, the gating signal RSEL<i> of each row of pixel circuit is connected, and i is the number of rows. Among them, when RSEL<i>=1, the pixel of the row is gated.

It should be understood that the pixel circuit shown in FIG. 5 is only an example, and an embodiment of the present application may also adopt a pixel circuit of other structures, including but not limited to a 4T pixel structure.

An embodiment of the present application does not define a structure of the output circuit 320 either.

Optionally, in an implementation manner, the operational amplifier in the output circuit 320 further includes a plurality of groups of transistors connected to its output ends. Among them, each group of transistors include a first transistor and a second transistor connected in series. The number of the plurality of groups of transistors (that is, the number of groups) is the same as the number of the plurality of pixel circuits that need to perform signal combination and averaging.

Further, a transconductance of the first transistor is same as that of the source follow input transistor of the pixel circuit. In other words, the first transistor and the source follow input transistor of the pixel circuit are the same transistors.

Moreover, the second transistor is a gating switch transistor same as the gating switch transistor of the pixel circuit.

Preferably, the first transistor, the source follow input transistor, the second transistor, and the gating switch transistor may all be the same transistors.

For example, in an implementation manner, the operational amplifier further includes a current mirror, one end of the current mirror is connected to the source follow input transistor of each pixel circuit, and the other end of the current mirror is connected to the first transistor in each group of transistors.

Further, optionally, the operational amplifier further includes a current source, one end of the current source is connected to the gating switch transistor of each pixel circuit and is connected to the second transistor in each group of transistors, and the other end of the current source is grounded.

For another example, in another implementation manner, the operational amplifier further includes a current mirror, one end of the current mirror is connected to the gating switch transistor of each pixel circuit, and the other end of the current mirror is connected to the second transistor in each group of transistors.

Further, optionally, the operational amplifier further includes a current source, one end of the current source is connected to the source follow input transistor of each pixel circuit and is connected to the first transistor in each group of transistors, and the other end of the current source is grounded.

Figure 6:
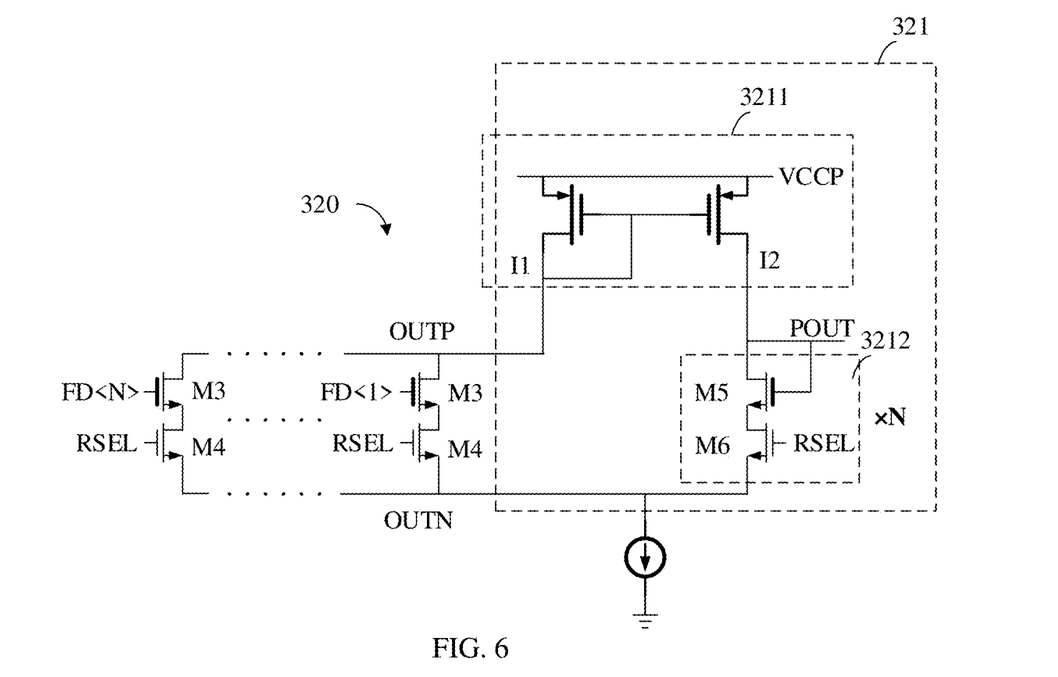
FIG. 6 is a schematic structural diagram of a possible output circuit according to an embodiment of the present application.

For example, the output circuit 320 as shown in FIG. 6, includes an operational amplifier 321. Assuming that the pixel circuit shown in FIG. 5 is adopted, FD<1> to FD<N> are gate voltages of the source follow input transistors M3 of the pixel circuits that need to perform signal combination and averaging, respectively. POUT, such as OUT1 in FIG. 4, is the output signal of the output end of the output circuit 320. The output end is connected to N groups of transistors 3212, and the N groups of transistors 3212 are connected in parallel, where each group of transistors 3212 includes a transistor M5 and a transistor M6 connected in series. Specifically, the output end may be connected to a gate of the transistor M5 in each group of transistors 3212.

Of the two input ends of the output circuit 320, one input end is connected to the output OUTP of each pixel circuit, and the other input end is connected to the output OUTN of each pixel circuit. In addition, a transconductance of the transistor M5 in the output circuit 320 is the same as the transconductance of the transistor M3. In other words, the transistor M5 in the output circuit 320 and the transistor M3 in the pixel circuit are the same transistors. In addition, the transistor M6 and the transistor M4 are the same gating switch transistors. Since when the output circuit 320 performs signal merging and averaging, the transistor M6 and the transistor M4 are both in an on state as switches, in the following, for ease of understanding, the transistor M6 and the transistor M4 may be regarded as wires.

It may be seen from FIG. 6 that the operational amplifier 321 includes a current mirror 3211, and an input end current and an output end current of the current mirror 3211 are I1 and I2, respectively, and I1=I2.

A voltage at the FD point of each pixel circuit in the pixel circuit array 310 generally has little differences, that is, a small signal hypothesis is established. Therefore, any one of FD<1> to FD<N> may be represented as FD<k>=VCM+ΔV<k>, where VCM is a common mode signal, ΔV<k> is a small signal, that is, FD<k> is relative to a slight change of VCM. Then, the input end current I1 is:

$$I1=I(CM)+gm(1)\times\Delta V(1)+gm(2)\times\Delta V(2)+\ldots gm(k)\times\Delta V(k)+\ldots +gm(N)\times\Delta V(N).$$

Among them, gm(1)=gm(2)= . . . =gm(k)= . . . = gm(N)=gm.

Therefore, $$I1=I(CM)+gm\times\Delta V(1)+\ldots gm\times LV(2)+\ldots +gm\times\Delta V(k)+\ldots +gm\times\Delta V(N).$$

Due to the function of the current mirror 3211, the current at the output end I2=I1, and the trans conductance of the transistor M5 in the plurality of groups of transistors 3212 is equal to N×gm. Therefore, the output POUT of the output circuit 320 is:

$$POUT =$$
$$VCM + [gm \times \Delta V(1) + gm \times \Delta V(2) + \ldots + gm \times \Delta V(k) + \ldots + gm \times \Delta V(N)]/$$
$$(N \times gm) = VCM + [\Delta V(1) + \Delta V(2) + \ldots + \Delta V(k) + \ldots + \Delta V(N)]/N =$$
$$(FD < 1 > +FD < 2 > +\ldots + FD < k > +\ldots + FD < N >)/N$$

It may be seen that the output circuit 320 adopts the operational amplifier 321 based on summation of multi-input transconducting currents, and realizes combination and averaging of the corresponding output signals FD<1>, FD<2>, . . . , FD<k>, . . . , FD<N>.

Overall, the operational amplifier 321 of the output circuit 320 in FIG. 6 adopts a basic structure of a five-transistor operational amplifier. Moreover, since the input end of the operational amplifier 321 is connected to N pixel circuits that need to perform signal combination and averaging, the output end of the operational amplifier is connected to N transistors M5 and N transistors M6 which are the same as the source follow input transistors M3 and the gating switch transistors M4 in the N pixel circuits, respectively, so to realize combining and averaging the output signals of the N pixel circuits.

Positions of the source follow input transistor M3 and the gating switch transistor M4 shown in FIG. 6 may be exchanged, and positions of the transistor M5 and the transistor M6 are exchanged at the same time.

It should be understood that the output circuit shown in FIG. 6 is only an example, and an embodiment of the present application may also adopt an output circuit of other structures, including but not limited to a five-transistor operational amplifier.

Figure 7:
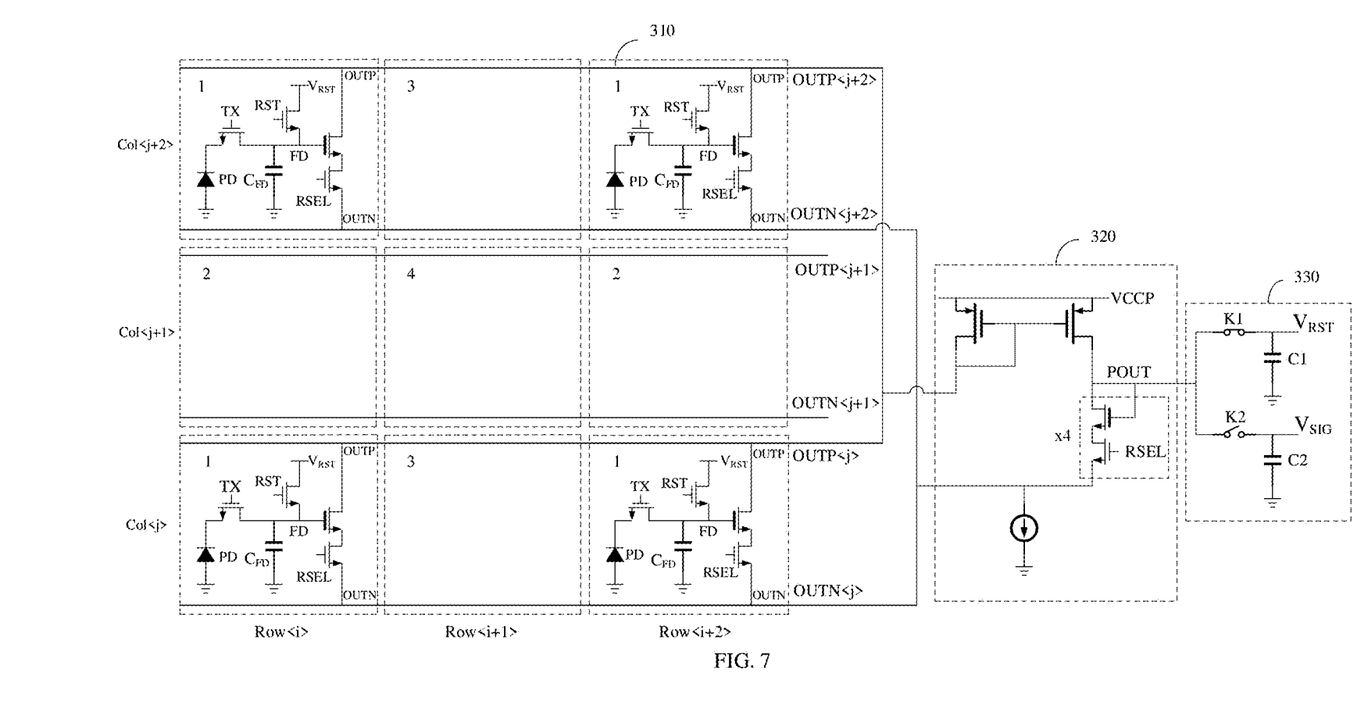
FIG. 7 is a possible schematic structural diagram of the image sensor based on FIG. 5 and FIG. 6.

FIG. 7 is a schematic diagram of the image sensor based on the pixel circuit of FIG. 5 and the output circuit 320 of FIG. 6. Among them, FIG. 7 only shows the 4 pixel circuits 1 currently gated, that is, N=4. The output signals OUTP and OUTN of the 4 pixel circuits 1 are two input ends respectively input to the output circuit 320. After receiving the output signals OUTP and OUTN of a plurality of pixel circuits, the output circuit 320 outputs the combined and averaged signal POUT.

Optionally, in an implementation manner, the sampling circuit 330 includes a first sampling capacitor and a second sampling capacitor, the first sampling capacitor and the second sampling capacitor are configured to collect the signal average value twice before and after the pixel circuit is exposed, respectively, so as to realize correlated double sampling.

For example, as shown in FIG. 7, the sampling circuit 330 is connected to the output circuit 320, where the first sampling capacitor C1 is connected to the output end of the output circuit 320 by switch K1, and the second sampling capacitor C2 is connected to the output end of the output circuit 320 by a switch K2. The switch K1 and K2 switch may be controlled, so that the signal average value are collected twice before and after the pixel circuit is exposed by the first sampling capacitor C1 and a second sampling capacitor C2, respectively. The former one is sampling of the reset level $V_{RST}$, and the latter one is sampling of the exposure signal level $V_{SIG}$. Differencing the two collected signals may eliminate reset noises and thus improve the performance of the image sensor.

An embodiment of the present application further provides a fingerprint detection apparatus, the fingerprint detection apparatus including the image sensor in the forgoing various embodiments of the present application. The fingerprint detection apparatus may be arranged below a display screen to realize under-screen fingerprint detection.

When the image sensor is applied in the fingerprint detection apparatus, the light signal received by the plurality of pixel circuits that need to perform signal combination and averaging is a light signal in the same direction, such as returned by a finger. In other words, the plurality of pixel circuits in each sub-array of the plurality of pixel circuit arrays are configured to receive the light signal in a plurality of directions, respectively.

A structure of the fingerprint detection apparatus may adopt, for example, a microlens and one or more light-blocking layers to realize reception of the light signal in different directions.

Optionally, in an implementation manner, the fingerprint detection apparatus further includes a light path guiding structure arranged above each sub-array, the light path guiding structure includes a microlens and a plurality of light-blocking layers arranged below the microlens, the uppermost light-blocking layer in the plurality of light-blocking layers is provided with at least one light-passing hole, and each light-blocking layer in the remaining light-blocking layers is provided with a plurality of light-passing holes to form a light guide path in a plurality of directions, the microlens is configured to converge a light signal returned by the finger above the display screen, and the light guide path in a plurality of directions is configured to guide the light signal in the corresponding direction to the corresponding pixel circuit.

Figure 8:
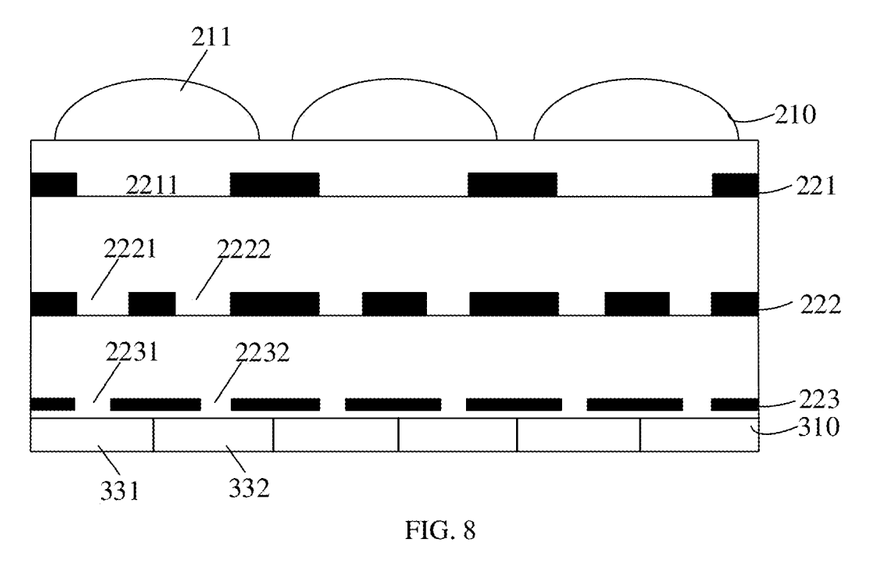
FIG. 8 is a schematic diagram of implementing a light path in a plurality of receiving directions of an embodiment of the present application.
Figure 9:
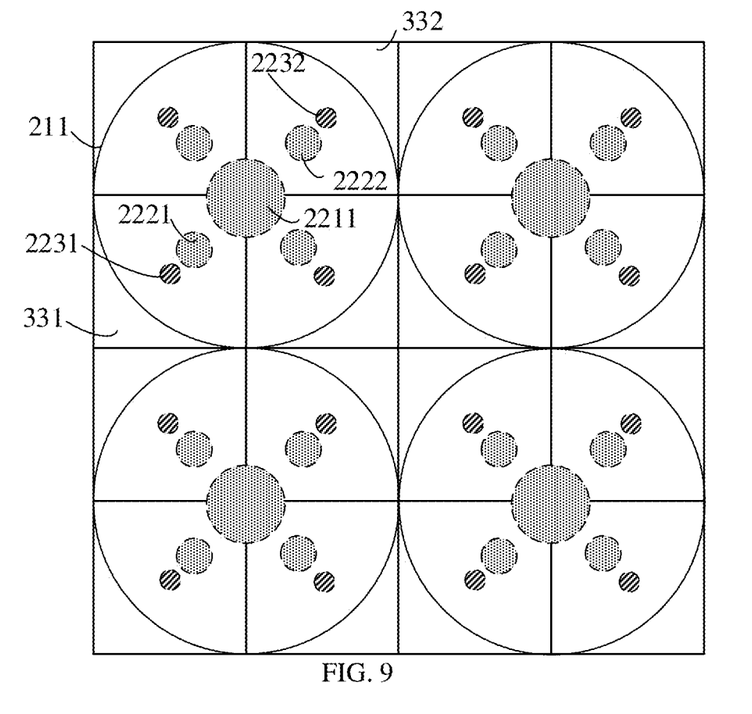
FIG. 9 is a schematic diagram of implementing a light path in a plurality of receiving directions of an embodiment of the present application.

Taking FIG. 8 and FIG. 9 as an example, the above pixel circuit with the same number may be used to receive the light in the same direction, and the foregoing pixel circuit 1, pixel circuit 2, pixel circuit 3, and pixel circuit 4 may be used to receive the light in four different directions, respectively. Among that, FIG. 8 is a cross-sectional view of a light path guiding structure above the three sub-arrays in the pixel circuit array 310, and FIG. 9 is a top view of the light path guiding structure above the four sub-arrays in the pixel circuit array 310.

Three light-blocking layers and a microlens layer are provided above the pixel circuit array 310 of the image sensor 300. The uppermost light-blocking layer is provided with a light-passing hole. Each light-blocking layer in the remaining light-blocking layers is provided with 4 light-passing holes to form 4 light guide paths in a plurality of directions. A light signal converged by the microlens passes through the 4 light guide paths respectively and reach the 4 pixel circuits respectively. As shown in FIG. 8, the microlens array 210 includes a plurality of microlenses 211, each microlens corresponding to one pixel unit, and each pixel unit including 4 pixels. A hole 2211 on a light-blocking layer 211, a hole 2221 on a light-blocking layer 222, and a hole 2231 on a light-blocking layer 223 form a light receiving direction. A light signal in the direction may be received by a pixel circuit 331. The hole 2211 on the light-blocking layer 211, a hole 2222 on the light-blocking layer 222, and a hole 2232 on the light-blocking layer 223 form another light receiving direction. The light signal in the direction may be received by the pixel circuit 332; and similarly, the top view of FIG. 9 shows 4 light receiving directions.

It should be understood that FIG. 8 and FIG. 9 are only examples, and other light path structures capable of realizing a plurality of receiving directions may also be applied in the fingerprint detection apparatus. For example, one microlens may also be provided for each pixel circuit, that is, one microlens corresponds to one pixel circuit.

In addition, the above only takes the light in four directions as an example. At this time, the pixel circuit included in one sub-array in the pixel circuit array is a pixel circuit with 2×2 different numbers. In practical applications, other numbers of light directions may also be adopted. For example, a sub-array includes two pixel circuits with different numbers, which are respectively configured to receive light from two different directions.

An embodiment of the present application further provides an electronic device, and the electronic device includes a screen the fingerprint detection apparatus in the foregoing various embodiments of the present application. Optionally, the fingerprint detection apparatus is arranged below the screen, to realize under-screen optical fingerprint detection.

By way of example and not limitation, the electronic device in the embodiment of the present application may be portable or mobile computing devices such as a terminal device, a mobile phone, a tablet computer, a notebook computer, a desktop computer, a gaming device, an in-vehicle electronic device or a wearable smart device, and other electronic devices such as an electronic database, an automobile and an automated teller machine (ATM). The wearable smart device includes a device that is full-featured and large-sized and may realize complete or partial functions without relying on a smart phone, such as a smart watch or smart glasses, and a device that only focuses on a certain type of application function, and shall be used in cooperation with such other device as a smart phone, such as various types of smart bracelets, smart jewelry and other devices for physical sign monitoring.

It should be noted that, under a premise of no conflict, various embodiments and/or technical features in the various embodiments described in the present application may be combined with each other arbitrarily, and the technical solutions obtained after the combination should also fall within the protection scope of the present application.

It should be noted that specific examples in embodiments of the present application are just for helping those skilled in the art better understand the embodiments of the present application, rather than for limiting the scope of the embodiments of the present application. Those skilled in the art can make various improvements and variations on the basis of the above embodiments, and such improvements or variations are all within the protection scope of the present application.

The foregoing descriptions are merely specific embodiments of the present application, but the protection scope of the present application is not limited thereto, those skilled in the art who are familiar with the art could readily think of variations or substitutions within the technical scope disclosed by the present application, and these variations or substitutions shall fall within the protection scope of the present application. Therefore, the protection scope of the present application shall be subject to the protection scope of the claims.

What is claimed is:

1. An image sensor, comprising:
a pixel circuit array, wherein each pixel circuit is configured to generate an output signal according to a received light signal; and
an output circuit, comprising an operational amplifier, wherein the operational amplifier comprises a first input end and a second input end, first output ends of a plurality of pixel circuits of the pixel circuit array are connected to the first input end of the operational amplifier, and second output ends of the plurality of pixel circuits are connected to the second input end of the operational amplifier;
wherein the operational amplifier is configured to simultaneously receive output signals of a plurality of pixel circuits in the pixel circuit array, and output a signal average value of the output signals of the plurality of pixel circuits, so that the output signals of the plurality of pixel circuits completes combination and averaging within the output circuit;
the operational amplifier further comprises a plurality of groups of transistors connected to its output end, wherein each group of transistors comprises a first transistor and a second transistor connected in series,
the number of the plurality of groups of transistors is the same as the number of the plurality of pixel circuits, a transconductance of the first transistor is the same as that of a source follow input transistor of a pixel circuit, the second transistor is a gating switch transistor same as a gating switch transistor of the pixel circuit, and the source follow input transistor and the gating switch transistor are connected in series between the first output end and the second output end of the pixel circuit.

2. The image sensor according to claim 1, further comprising:
a sampling circuit, configured to collect the signal average value output by the output circuit.

3. The image sensor according to claim 2, wherein, the sampling circuit comprises a first sampling capacitor and a second sampling capacitor, the first sampling capacitor and the second sampling capacitor are configured to collect the signal average value twice before and after the pixel circuit is exposed, respectively, so as to realize correlated double sampling.

4. The image sensor according to claim 1, wherein the pixel circuit array is composed of a plurality of sub-arrays, the plurality of pixel circuits comprise pixel circuits with the same number in the plurality of sub-arrays, and the pixel circuits with the same number in respective sub-arrays are located in the same row and column in respective corresponding sub-arrays.

5. The image sensor according to claim 4, wherein, the image sensor is configured in a fingerprint detection apparatus, wherein, the light signal received by the plurality of pixel circuits is a light signal in the same direction returned by a finger.

6. The image sensor according to claim 1, wherein, the operational amplifier further comprises a current mirror, one end of the current mirror is connected to the source follow input transistor of the each pixel circuit, and the other end of the current mirror is connected to the first transistor in each group of transistors.

7. The image sensor according to claim 6, wherein, the operational amplifier further comprises a current source, one end of the current source is connected to the gating switch transistor of the each pixel circuit and is connected to the second transistor in each group of transistors, and the other end of the current source is grounded.

8. The image sensor according to claim 1, wherein, the operational amplifier further comprises a current mirror, one end of the current mirror is connected to the gating switch transistor of the each pixel circuit, and the other end of the current mirror is connected to the second transistor in each group of transistors.

9. The image sensor according to claim 8, wherein, the operational amplifier further comprises a current source, one end of the current source is connected to the source follow input transistor of the each pixel circuit and is connected to the first transistor in each group of transistors, and the other end of the current source is grounded.

10. The image sensor according to claim 1, wherein, the pixel circuit further comprises a photodiode, a parasitic capacitor, a reset switch transistor and a transmission transistor, wherein, a cathode of the photodiode is grounded, an anode of the photodiode is connected to a source of the transmission transistor, a gate of the transmission transistor is controlled by a transmission signal, and a drain of the transmission transistor is connected to one end of the parasitic capacitor, a gate of the source follow input transistor and a source of the reset switch transistor, the other end of the parasitic capacitor is grounded, a drain of the reset switch transistor is connected to a reset voltage, a gate of the reset switch transistor is controlled by a reset signal, a gate of the gating switch transistor is controlled by a gating signal, a source of the source follow input transistor is connected to a drain of the gating switch transistor, and one end of a drain of the source follow input transistor and one end of a source of the gating switch transistor are used as the first output end and the second output end of the pixel circuit, respectively.

11. A fingerprint detection apparatus, wherein it is configured to be arranged under a display screen of an electronic device, and the fingerprint detection apparatus comprises an image sensor, wherein the image sensor comprises:

a pixel circuit array, wherein each pixel circuit is configured to generate an output signal according to a received light signal; and an output circuit, comprising an operational amplifier, wherein the operational amplifier comprises a first input end and a second input end, first output ends of a plurality of pixel circuits of the pixel circuit array are connected to the first input end of the operational amplifier, and second output ends of the plurality of pixel circuits are connected to the second input end of the operational amplifier;

wherein the operational amplifier is configured to simultaneously receive output signals of a plurality of pixel circuits in the pixel circuit array, and output a signal average value of the output signals of the plurality of pixel circuits, so that the output signals of the plurality of pixel circuits completes combination and averaging within the output circuit;

the operational amplifier further comprises a plurality of groups of transistors connected to its output end, wherein each group of transistors comprises a first transistor and a second transistor connected in series, the number of the plurality of groups of transistors is the same as the number of the plurality of pixel circuits, a transconductance of the first transistor is the same as that of a source follow input transistor of a pixel circuit, the second transistor is a gating switch transistor same as a gating switch transistor of the pixel circuit, and the source follow input transistor and the gating switch transistor are connected in series between the first output end and the second output end of the pixel circuit.

12. The fingerprint detection apparatus according to claim 11, the image sensor further comprising:

a sampling circuit, configured to collect the signal average value output by the output circuit.

13. The fingerprint detection apparatus according to claim 11, wherein the pixel circuit array is composed of a plurality of sub-arrays, the plurality of pixel circuits comprise pixel circuits with the same number in the plurality of sub-arrays, and the pixel circuits with the same number in respective sub-arrays are located in the same row and column in respective corresponding sub-arrays.

14. The fingerprint detection apparatus according to claim 11, wherein, the plurality of pixel circuits in each sub-array of the pixel circuit array in the image sensor are configured to receive a light signal in a plurality of directions, respectively, wherein, the fingerprint detection apparatus further comprises a light path guiding structure arranged above each sub-array, the light path guiding structure comprises a microlens and a plurality of light-blocking layers arranged below the microlens, the uppermost light-blocking layer in the plurality of light-blocking layers is provided with at least one light-passing hole, and each light-blocking layer in the remaining light-blocking layers is provided with a plurality of light-passing holes to form a light guide path in the plurality of directions, the microlens is configured to converge a light signal returned by a finger above the display screen, and the light guide path in the plurality of directions is configured to guide the light signal in the corresponding direction to the corresponding pixel circuit.

15. An electronic device, comprising: a fingerprint detection apparatus, and the fingerprint detection apparatus comprises an image sensor, wherein the image sensor comprises:

a pixel circuit array, wherein each pixel circuit is configured to generate an output signal according to a received light signal; and an output circuit, comprising an operational amplifier, wherein the operational amplifier comprises a first input end and a second input end, first output ends of a plurality of pixel circuits of the pixel circuit array are connected to the first input end of the operational amplifier, and second output ends of the plurality of pixel circuits are connected to the second input end of the operational amplifier;

wherein the operational amplifier is configured to simultaneously receive output signals of a plurality of pixel circuits in the pixel circuit array, and output a signal average value of the output signals of the plurality of pixel circuits, so that the output signals of the plurality of pixel circuits completes combination and averaging within the output circuit;

the operational amplifier further comprises a plurality of groups of transistors connected to its output end, wherein each group of transistors comprises a first transistor and a second transistor connected in series, the number of the plurality of groups of transistors is the same as the number of the plurality of pixel circuits, a transconductance of the first transistor is the same as that of a source follow input transistor of a pixel circuit, the second transistor is a gating switch transistor same as a gating switch transistor of the pixel circuit, and the source follow input transistor and the gating switch transistor are connected in series between the first output end and the second output end of the pixel circuit.

* * * * *